United States Patent
Hynecek

(10) Patent No.: US 9,082,896 B2
(45) Date of Patent: Jul. 14, 2015

(54) SMALL PIXEL FOR CMOS IMAGE SENSORS WITH VERTICALLY INTEGRATED SET AND RESET DIODES

(71) Applicant: Intellectual Ventures II LLC, Wilmington, DE (US)

(72) Inventor: Jaroslav Hynecek, Allen, TX (US)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

(21) Appl. No.: 13/737,410

(22) Filed: Jan. 9, 2013

(65) Prior Publication Data

US 2013/0143351 A1 Jun. 6, 2013

Related U.S. Application Data

(60) Continuation of application No. 13/088,027, filed on Apr. 15, 2011, now Pat. No. 8,362,532, which is a division of application No. 12/153,060, filed on May 13, 2008, now Pat. No. 7,928,484.

(30) Foreign Application Priority Data

May 14, 2007 (KR) .............................. 2007-0046616

(51) Int. Cl.
*H01L 31/02* (2006.01)
*H01L 27/146* (2006.01)

(52) U.S. Cl.
CPC ...... *H01L 31/02016* (2013.01); *H01L 27/1463* (2013.01); *H01L 27/14603* (2013.01); *H01L 27/14609* (2013.01)

(58) Field of Classification Search
None
See application file for complete search history.

(56) References Cited

U.S. PATENT DOCUMENTS

| 4,980,546 A | 12/1990 | Berger |
| 5,625,210 A | 4/1997 | Lee et al. |
| 5,786,615 A | 7/1998 | Saito |
| 5,881,184 A | 3/1999 | Guidash |
| 5,904,493 A | 5/1999 | Lee et al. |
| 6,797,935 B2 | 9/2004 | Kaya et al. |
| 7,176,462 B2 | 2/2007 | Mabuchi |
| 2004/0036789 A1 | 2/2004 | Shinohara |
| 2005/0087784 A1 | 4/2005 | Lee et al. |
| 2006/0108507 A1 | 5/2006 | Huang |
| 2006/0246653 A1* | 11/2006 | Bhattacharyya ............... 438/237 |
| 2007/0007559 A1 | 1/2007 | Lee et al. |
| 2007/0024255 A1 | 2/2007 | Yasumura |
| 2007/0257286 A1 | 11/2007 | Hynecek |

FOREIGN PATENT DOCUMENTS

| KR | 1020040065963 | 7/2004 |
| KR | 1020050026897 | 3/2005 |
| KR | 1020070108010 | 11/2007 |

OTHER PUBLICATIONS

Hidekazu Takahashi et al., "A 1/2.7 inch Low-Noise CMOS Image Sensor for Full HD Camcorders," 2007 IEEE International Solid-State Circuit Conference, Session 28, Paper 28.6, Digest of Technical Papers, pp. 510-511, 2007.
Office Action mailed Mar. 19, 2010 (U.S. Appl. No. 12/153,140, filed May 14, 2008).

* cited by examiner

*Primary Examiner* — Mamadou Diallo
(74) *Attorney, Agent, or Firm* — McAndrews, Held & Malloy, Ltd.

(57) ABSTRACT

A pixel of an image sensor, the pixel includes a floating diffusion node to sense photo-generated charge, a reset diode to reset the floating diffusion node in response to a reset signal, and a set diode to set the floating diffusion node.

21 Claims, 5 Drawing Sheets

SMALL PIXEL FOR CMOS IMAGE SENSORS WITH VERTICALLY INTEGRATED SET AND RESET DIODES

CROSS-REFERENCE TO RELATED APPLICATIONS

The present application is a continuation application of U.S. application Ser. No. 13/088,027, filed on Apr. 15, 2011, which is a divisional application of U.S. application Ser. No. 12/153,060, filed on May 13, 2008, which claims priority of Korean patent application number 2007-0046616, filed on May 14, 2007, all of which are incorporated herein by reference in their entirety.

BACKGROUND OF THE INVENTION

The present invention relates to solid-state image sensors, specifically to CMOS image sensors that have very small pixel sizes. In particular this invention relates to pixels that use only two transistors (2T) and two diodes for the reset and addressing instead of the typical reset and addressing transistors. Furthermore the diodes can be built vertically on top of a silicon substrate and have a very small size in order not to occupy a valuable pixel area. The described pixels are still capable of standard low noise correlated double sampling operation as is typically used with 4T pixel architectures.

Typical image sensors sense light by converting impinging photons into electrons that are integrated (collected) in sensor pixels. After completion of integration cycle, collected charge is converted into a voltage, which is supplied to output terminals of the sensors. In typical CMOS image sensors, the charge to voltage conversion is accomplished directly in the pixels themselves and the analog pixel voltage is transferred to the output terminals through various pixel addressing and scanning schemes.

The analog signal can also be converted on-chip to a digital equivalent before reaching the chip output. The pixels have incorporated in them a buffer amplifier, typically a source follower, which drives the sense lines that are connected to the pixels by suitable addressing transistors. After charge to voltage conversion is completed and the resulting signal is transferred out from the pixels, the pixels are reset in order to be ready for accumulation of new charge. In pixels that are using Floating Diffusion (FD) as a charge detection node, the reset is accomplished by turning on a reset transistor that momentarily conductively connects the FD node to a voltage reference. This step removes collected charge; however, it generates kTC-reset noise as is well known in the art. The kTC noise has to be removed from the resulting signal by the Correlated Double Sampling (CDS) signal processing technique in order to achieve desired low noise performance. The typical CMOS sensors that utilize the CDS concept need to have four transistors (4T) in the pixel. An example of the 4T pixel circuit can be found in the U.S. Pat. No. 5,991,184 to Guidash.

Recently a new pixel operation technique is gaining popularity in the literature and in many products. A 3T pixel where the addressing transistor is eliminated from the pixel is introduced. In an image sensor with the 3T pixel, the pixel addressing is accomplished by a source follower transistor itself through applying a suitable bias on FD nodes that are not selected. The latest description of this concept can be found for example in the: ISSCC 2007 Digest of Technical Papers, "A ½.7 inch Low-Noise CMOS Image Sensor for Full HD Camcorders" pp. 510~511, by Hidekazu Takahashi et al. Eliminating the addressing transistor from the pixel saves the valuable pixel area and also eliminates one control wire that was needed for controlling the addressing transistor gate.

FIG. 1 illustrates a simplified circuit diagram of a typical 3T CMOS image sensor pixel with a pinned photodiode for sensing light and switched drain bias for addressing.

Referring to FIG. 1, a photodiode 101 is coupled through a charge transfer transistor 102 to a FD node 103. A sensing source follower (SF) transistor 104 has its gate connected to the FD node 103, a drain connected to a Vdd node 105 and a source connected to an output column bus 106. The Vdd node 105 is connected to a Vdd column bus 107 and a drain switch 108. The FD node 103 is reset to the Vdd node 105 by a reset transistor 109. A gate of the reset transistor 109 is controlled by a row bus line 110 and the gate of the charge transfer transistor 102 is controlled by a second row bus line 111. As photons 112 impinge on the photodiode 101, electron charge is generated there. After completion of charge integration, the FD node 103 is reset and all charge from the photodiode 101 is transferred on the FD node 103. This changes a FD voltage from an original reset level to a new signal level. Both of the reset level and the signal level on the FD node 103 are then sensed by the transistor 104 and both levels are transferred onto the output bus 106 and further into column signal processing circuits for subtraction and additional processing. The subtraction of the reset level from the signal level is called Correlated Double Sampling (CDS), which removes the kTC noise and the transistor threshold non-uniformities from the signal. In order to prevent interference from signals that are generated on the transistors 104 of pixels in the remaining rows that are not addressed and are connected to the same column 106, the FD nodes of these transistors are set low. This turns the SF of these pixels off, since the SF of the selected pixel is biased high.

The advantages of the 3T pixel circuit are that fewer transistors occupy less pixel area and the elimination of the addressing transistor eliminates the gate addressing line, lowers the pixel output impedance, and thus eliminates noise generated in that transistor. However, the 3T still occupy a significant amount of the valuable active pixel area, which is a problem for further reduction of pixel size and thus cost of the CMOS image sensors. This disadvantage is often times compensated by sharing the pixel circuit with several photodiodes. However, the circuit sharing has also its disadvantages. In such circuits, the FD node capacitance is increased, which reduces the pixel sensitivity, and the interconnection lines also occupy the valuable pixel area. Other disadvantages of the sharing concept are slightly asymmetrical layout and electrical functions that result in some asymmetrical optical as well as electrical cross talk problems. It is therefore desirable to design pixel that have very small size and that do not require excessive sharing of the circuits.

SUMMARY OF THE INVENTION

Embodiments of the present invention relate to a small pixel for CMOS image sensors with vertically integrated set and reset diodes.

In accordance with an aspect of the present invention, there is provided a pixel of an image sensor. The pixel comprises a floating diffusion node to sense photo-generated charge, a reset diode to reset the floating diffusion node in response to a reset signal, and a set diode to set the floating diffusion node.

In accordance with another aspect of the present invention, there is provided a pixel array of an image sensor. The pixel array comprises a plurality of pixels, each comprising a floating diffusion node to sense photo-generated charge, a reset diode to reset the floating diffusion node in response to a reset signal, and a set diode to set the floating diffusion node, wherein the pixels are arranged in rows and columns.

In accordance with still another aspect of the present invention, there is provided a pixel array of an image sensor. The pixel array comprises a plurality of pixels, each comprising a sensing node to sense photo-generated charge, a transfer transistor to transfer the photo-generated charge from a photo-diode to the sensing node in response to a voltage level of a signal from a transfer control signal line, a reset diode coupled between the sensing node and a reset signal line, a drive transistor having a gate coupled to the sensing node, one node coupled to a first bus line, and the other node coupled to a second bus line, and a set diode coupled between the sensing node and the first bus line, wherein the pixels are arranged in rows and columns.

In accordance with still another aspect of the present invention, there is provided a method for reading out a signal from a pixel array. The method comprises switching a power supply voltage level of first bus lines from a low level to a high level and simultaneously supplying a reset voltage of a low voltage level to reset signal lines, supplying a reset pulse to one of the reset signal lines after a certain period of time of the simultaneous power supply voltage level switching and reset voltage supplying, supplying a transfer pulse to one of transfer control signal lines after a certain period of time of the reset pulse supplying, switching the power supply voltage level of the first bus lines from the high level to the low level and simultaneously supplying the reset voltage of a high voltage level to the reset signal lines after a certain period of time of the transfer pulse supplying.

DESCRIPTION OF SPECIFIC EMBODIMENTS

Embodiments of the present invention relate to a small pixel of CMOS image sensors with vertically integrated set and reset diodes.

Figure 1:
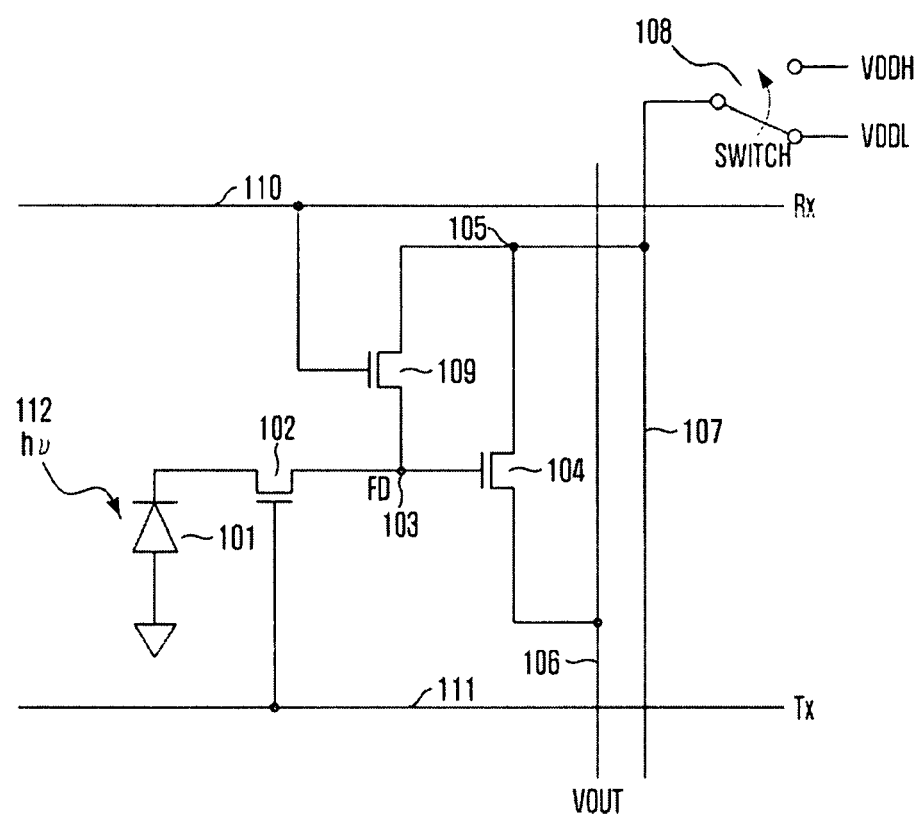
FIG. 1 illustrates a simplified circuit diagram of a standard typical 3T CMOS image sensor pixel with a pinned photo-diode and a switched drain bias.
Figure 2:
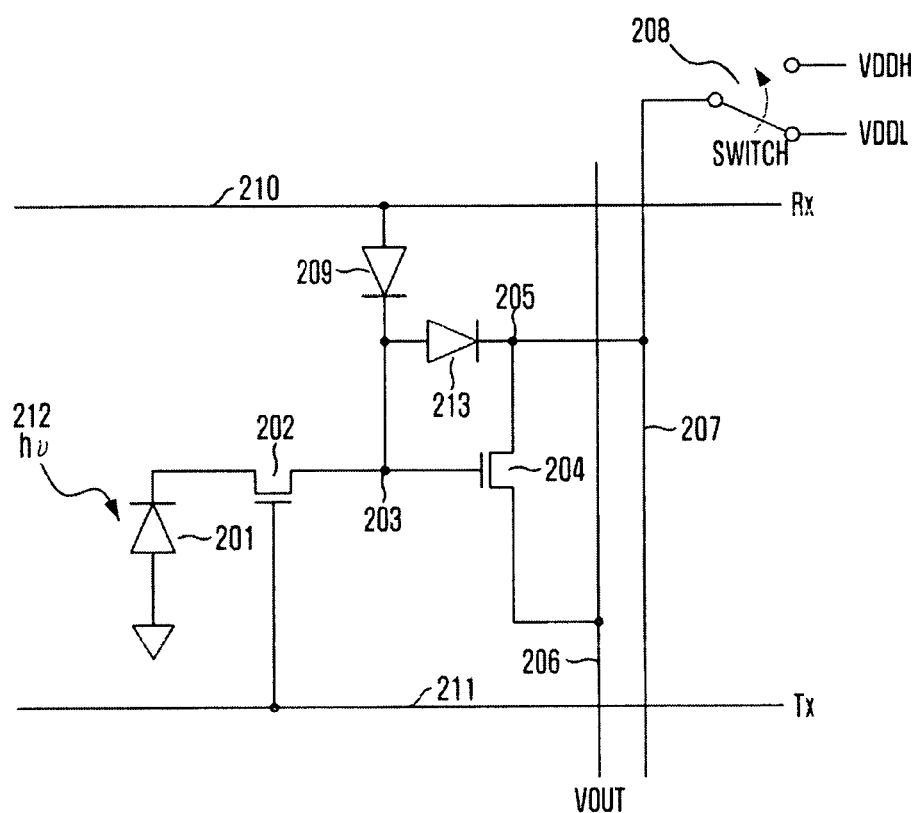
FIG. 2 illustrates a simplified circuit diagram of a 2T CMOS image sensor pixel with a pinned photodiode and set and reset diodes in accordance with the present invention.

FIG. 2 illustrates a simplified circuit diagram a 2T CMOS image sensor pixel with a pinned photodiode and set and reset diodes replaced with reset and addressing transistors.

Referring to FIG. 2, the pinned photodiode 201 is coupled through a charge transfer transistor 202 to a charge detection floating diffusion (FD) node 203. The FD node 203 is reset by a first p-n diode 209 that is connected to a reset line 210. The voltage on the FD node 203 is sensed by an n-channel MOS transistor 204 that has its gate connected to the FD node 203, a source connected to an output column bus line 206, and a drain connected to a drain node 205, which is further connected to a drain bus 207. The drain bus 207 is connected to a drain switch 208 that has a capability of switching the drain voltage between two levels, Vddh (Vdd high) and Vddl (Vdd low). A second p-n diode 213 is also included in the circuit, which is connected between the FD node 203 and the drain node 205. Charge generated in the pinned photo-diode 201 by photons 212 is transferred from the photodiode 201 to the FD node 203 by the transistor 202 that has its gate connected to a pixel row charge transfer line 211.

Figure 3:
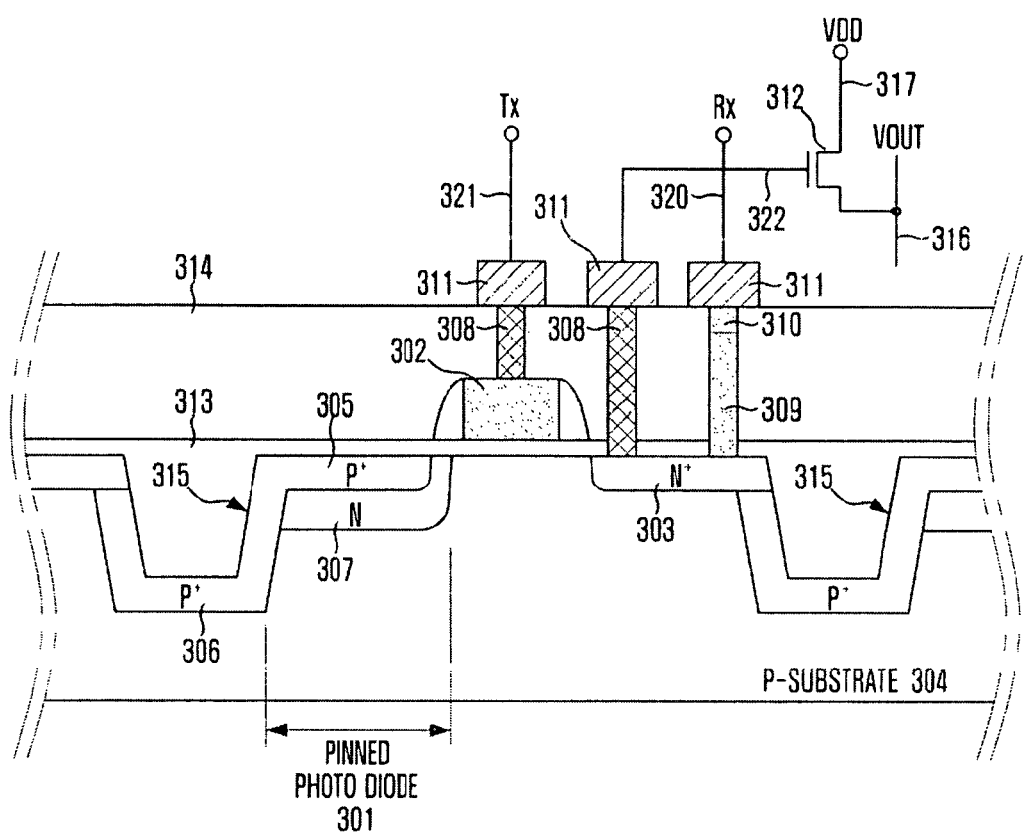
FIG. 3 illustrates a cross sectional view of an embodiment of the present invention where diodes are grown epitaxially or deposited as a poly-silicon plug in a circuit contact region.

FIG. 3 illustrates a cross sectional view of an embodiment of the present invention where diodes are grown epitaxially or deposited as a poly-silicon plug in a circuit contact region.

Referring to FIG. 3, a portion of a pixel includes a pinned photodiode region 301, a charge transfer transistor with its poly-silicon gate 302 and an N+ doped FD node 303. The pinned photodiode is formed by a P+-type doped layer 305 located close to a surface of a silicon substrate 304 and an N-type doped layer 307 where the photo-generated charge is stored therein. The P+ doped layer 305 extends all the way along a side of a STI trench 315. The STI trench 315 is filled with a silicon dioxide layer 313 that further extends along the surface of the silicon substrate 304 under the transfer gate 302 of the charge transfer transistor. Another layer of dioxide or other suitable dielectric layer 314 is deposited over the entire structure to provide isolation for metal interconnectors 311 that provide the necessary connections for the circuit. The metal interconnectors 311 receive their signals from the circuit nodes built into the silicon substrate 304 via holes opened in the dielectric layer 314 and the silicon dioxide layer 313. The holes are filled with metal plugs 308. The rest of the pixel circuits is shown only schematically by a third line 322 that connects the FD node 303 to a gate of a SF transistor 312 and by first and second lines 320 and 321 that connect the gate of the charge transfer transistor and a reset diode to the respective bus lines. A drain of the SF transistor 312 is connected to a drain bus 317 and a source of the SF transistor 312 is connected to a source bus 316. An important element of the circuit is a conductive layer 309 for the reset diode that is plugged in the opening and is connected to the FD node 303. The conductive layer 309 fills the opening with epitaxially grown p-type silicon, p-type doped poly-silicon, amorphous silicon or any other suitable semiconductor material. An upper portion of the conductive layer 309 has a p+ type doped region 310 in it to make certain that a good Ohmic contact against the metal interconnect layer 311 on the P+ doped region 310 is obtained. The set diode has a structure similar to that of the reset diode. That is, the set diode is formed over the drain diffusion layer of the SF transistor but this is not shown in this figure.

In this embodiment, the reset and set diodes are vertically formed by a contact of the conductive layer through the opening. However, the reset and set diodes may include a junction diode formed by implanting or diffusing impurities. Furthermore, the reset and set diodes may include a Schottky barrier diode formed by a metal-silicon interface. Many other details and features that are typically used in the construction of the modern pixel, such as the various other insulating and metal layers, color filter layers, and micro-lenses are well known to those skilled in the art but were for simplicity omitted from the drawing. Also, the drawing is not to scale so the relative thicknesses and the pixel size may not truly represent the real pixel dimensions.

Figure 4:
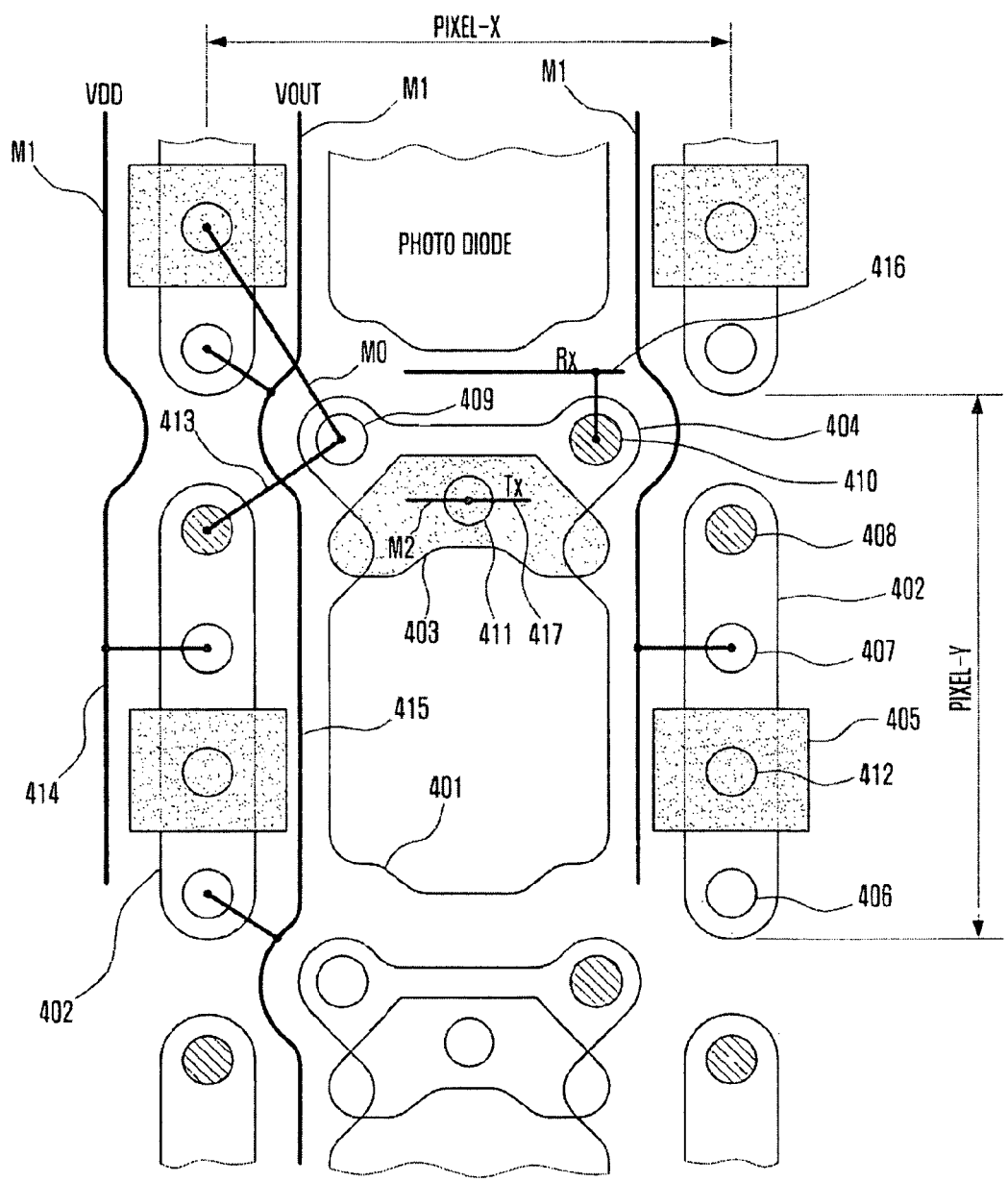
FIG. 4 illustrates a view of a layout implementation of the 2T CMOS image sensor pixel with set and reset diodes placed in the circuit contact region in accordance with the present invention.

FIG. 4 shows a view of a layout implementation of a 2T transistor CMOS sensor pixel in accordance with an embodiment of the present invention.

Referring to FIG. 4, a region 401 represents an active region according to STI technology that contains a pinned photodiode region, a transfer gate region 403 and an FD region 404. Another active region 402 separated from the previous region 401 by STI isolation contains the SF transistor formed by a gate 405. The contact to the source of the SF transistor is provided through a contact hole 406 and that to the drain is provided through a contact hole 407.

The p-type set diode is formed in a first contact hole 408. The connection with the FD region 404 is accomplished by a contact hole 409. The reset diode is formed in a second contact hole 410. The connection to the gate of the transfer gate transistor is provided through a contact hole 411 and the connection to the gate of the SF transistor is provided through a third contact hole 412.

The metal interconnectors that complete the circuit are shown in this drawing schematically for simplicity. A first interconnector 413 is partially shown to the pixel and is formed by a special metal line called M0. A second interconnector 414 provides the Vdd bias to the pixel and is common to all pixels in a column. This interconnect is formed by a metal line M1. Similarly a pixel output interconnector 415 connects all the pixels in one column together and is also formed by the metal line M1. A metal line M2 is used for a row reset line connecting the reset diode to a reset bus 416 and the same metal line M2 is also used for a charge transfer control signal line 417 that controls all the charge transfer gates in a given array. Other pixel features, for example, the color filter and lens boundaries, are for simplicity omitted from the drawing. The pixel does not share any circuitry with neighboring pixels, but it is possible to easily make such a shared layout by simply mirroring images. This pixel layout in a horizontal direction provides another bus line for a charge transfer signal and switches the allocation of the contact and the reset diode to the FD region. This provides a completely symmetrical shared layout that, has an advantage of minimum color shading or any other electrical problems related to the asymmetry of standard shared pixel layouts.

Figure 5:
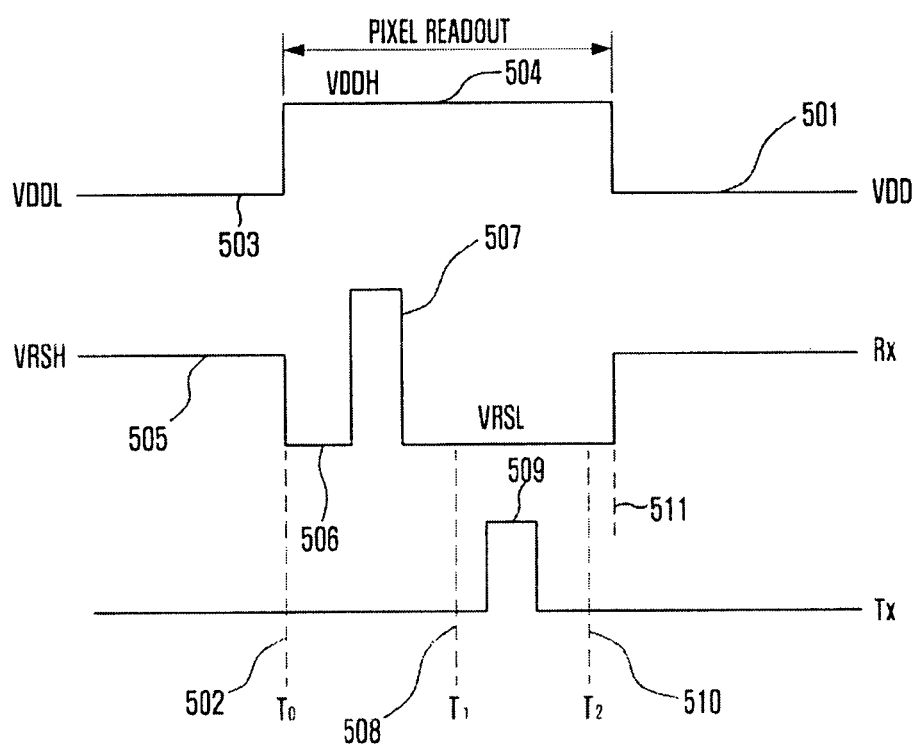
FIG. 5 is a simplified timing diagram describing an operation of the inventive pixel during addressing reset and sensing cycles.

FIG. 5 is a simplified timing diagram describing an operation of the inventive pixel during is addressing reset and sensing cycles.

Referring to FIGS. 2 and 5, a solid line 501 represents a pulse waveform supplied to the pixel drain bus 207 by switching the switch 208 from a Vddl low level 503 to a Vddh high level 504. This occurs at the beginning of a pixel readout cycle 502. At the same time, the bias of the pixel reset line 210 is lowered from a high reset level 505, Vrsh, to a low reset level 506, Vrsl. This operation is important for canceling the capacitive feed caused by the parasitic capacitance of the reverse biased diode 213 and thus maintaining the desired bias of the FD node 203 of all pixels in the array. In the next step, a pulse 507 is applied to the selected reset line 210 which resets the FD node 203 to a suitable level that is needed for the charge sensing. The suitable level is controlled by adjusting the amplitude of the reset pulse 507. After the reset cycle is completed at the time t1 508 and the reset level sensed at the output node of the SF transistor by the signal processing circuits located at the periphery of the array, the transfer gate of the charge transfer transistor 202 is pulsed by a pulse 509 and charge from the photodiode 201 is transferred on the FD node 203. The FD node voltage is changed in proportion to transferred charge and this change is sensed by the output node of the SF transistor again at the time t2 510. The resulting signal is then sensed by the peripheral signal processing circuits that have a capability to eliminate kTC noise or accomplish other signal processing tasks. During this cycle, all the not addressed rows that had the same Vrsl applied to them except the reset pulse 507 that is applied only to the addressed row. This scheme thus guarantees that all the not addressed lines have the FD biased at a predetermined low level and thus all the corresponding SF transistors turned off. This prevents interference that might occur otherwise from the signals of other pixels that are connected to the same column bus line. The pixel readout cycle is completed at the time 511 when the Vddh and Vrsl are returned to their original starting levels. The bias on the FD node outside the readout interval is controlled by choosing, the suitable bias levels for the Vddl and Vrsh. The FD node is reset by the first p-n diode 209 and set again to the low level by the second p-n diode 213. The small voltage difference between the Vddl and Vrsh keeps the first and second p-n diodes 209 and 213 slightly forward biased, which prevents the potential of the FD node from drifting away from the desired low level. The diode forward bias current can be very small, comparable to the diode dark current in order not to unnecessarily increase the image sensor power consumption. The diodes may not be required to have a particularly high quality, since the pixel readout time is very short and not much charge can accumulated on the FD node from the diode reverse leakage current during this time. This makes the construction of the diodes particularly advantageous since a simple epitaxial or even poly-silicon deposition processing can be used for their formation.

Other possibilities of shared pixel layouts are of course also possible as is well known to those skilled in the art. In addition the photodiode sharing can be accomplished without sacrificing any pixel symmetry and sensitivity that is caused by a long FD wiring interconnector. From the description of this layout embodiment is clear that the pixel with the set and reset diodes can have a very compact layout that significantly enhances its performance.

Having thus described the preferred embodiments of a novel CMOS image sensor pixel which has only two transistors and two p-n set and reset diodes, which is intended to be illustrative and not limiting, it is noted that persons skilled in the art can make modifications and variations in light of the above teachings. It is therefore to be understood that changes may be made in the particular embodiments of the invention disclosed, which are within the scope and spirit of the invention as defined by appended claims:

In this disclosure this concept is significantly advanced by also eliminating the reset transistor from the pixel and replacing it with two diodes. The diodes can be built with very small sizes and placed vertically above the silicon substrate in a poly-silicon or epitaxially grown silicon plugs. This further minimizes the pixel area that is normally occupied by the addressing and resetting transistors. Using this concept it is also possible to maintain the minimum pixel wiring and thus significantly improve performance of the small pixels over the existing state of the art. By optimizing the pixel layout with the vertically built set and reset diodes, it is possible to obtain significant improvements in Quantum Efficiency and maximum charge storage capacity. This in turn improves the pixel sensitivity, Dynamic Range (DR), and Signal to Noise Ratio (SNR).

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for making a pixel of an image sensor, the method comprising:
   forming a floating diffusion node in a substrate;
   forming a dielectric layer over the floating diffusion node, where the dielectric layer includes an opening extending vertically through the dielectric layer to the floating diffusion node; and forming a vertically-oriented reset diode in the opening such that the reset diode is in contact with the floating diffusion node, wherein said forming a vertically-oriented reset diode includes forming a first vertical portion of the vertically-oriented reset diode by depositing a doped semiconductor of a first doping level of a given doping type in electrical contact with the floating diffusion node; and forming a second vertical portion of the vertically-oriented reset diode by depositing a doped semiconductor of a second doping level of the given doping type, wherein the second vertical portion is in electrical contact with the first vertical portion, and wherein the second doping level is greater than the first doping level.

2. The method of claim 1, further comprising forming a metal layer in contact with the second vertical portion of the vertically-oriented reset diode.

3. The method of claim 1, wherein the first and second vertical portions are formed from a p-type doped material.

4. The method of claim 1, wherein said forming a first vertical portion comprises filling the opening with an epitaxially-grown p-type silicon.

5. The method of claim 1, wherein said forming a first vertical portion comprises filling the opening with a p-type doped polysilicon.

6. The method of claim 1, wherein said forming a first vertical portion comprises filling the opening with an amorphous silicon.

7. A method for making a pixel of an image sensor, the method comprising:

forming a floating diffusion node in a substrate;
forming a photodiode in the substrate;
forming a charge transfer transistor in the substrate, wherein the charge transfer transistor is configured to control charge transfer between the photodiode and the floating diffusion node;
forming a dielectric layer over the charge transfer transistor and the floating diffusion node, wherein the dielectric layer includes a first opening extending vertically through the dielectric layer to a gate of the charge transfer transistor and a second opening extending vertically through the dielectric layer to the floating diffusion node;
forming a metal plug in the first opening such that the metal plug is in contact with the gate of the charge transfer transistor; and
forming a vertically-oriented reset diode in the second opening such that the reset diode is in contact with the floating diffusion node.

8. The method of claim 7, wherein said forming a vertically-oriented reset diode comprises:

forming a first vertical portion of the vertically-oriented reset diode by depositing a doped semiconductor of a first doping level of a doping type in the second opening in electrical contact with the floating diffusion node; and forming a second vertical portion of the vertically-oriented reset diode by depositing a doped semiconductor of a second doping level of the doping type in the second opening, wherein the second vertical portion is in electrical contact with the first vertical portion, and wherein the second doping level is greater than the first doping level.

9. The method of claim 8, further comprising forming a metal layer in contact with the second vertical portion of the vertically-oriented reset diode.

10. The method of claim 8, wherein the first and second vertical portions are formed from a p-type doped material.

11. The method of claim 7, wherein said forming a vertically-oriented reset diode comprises filling the second opening with an epitaxially grown p-type silicon.

12. The method of claim 7, wherein said forming a vertically-oriented reset diode comprises filling the second opening with a p-type doped polysilicon.

13. The method of claim 7, wherein said forming a vertically-oriented reset diode comprises filling the second opening with an amorphous silicon.

14. A method for making a pixel of an image sensor, the method comprising:

forming a floating diffusion node in a substrate;
forming a photodiode in the substrate;
forming a charge transfer transistor in the substrate, wherein the charge transfer transistor is configured to control charge transfer between the photodiode and the floating diffusion node;
forming a common emitter transistor in the substrate, wherein the common emitter transistor is configured to control an output of the image sensor;
forming a dielectric layer over the charge transfer transistor, the common emitter transistor, and the floating diffusion node, wherein the dielectric layer includes a first opening extending vertically through the dielectric layer to a gate of the charge transfer transistor, a second opening extending vertically through the dielectric layer to a gate of the common emitter transistor, and third and fourth openings respectively extending through the dielectric layer to the floating diffusion node;
forming a first metal plug in the first opening such that the first metal plug is in contact with the gate of the charge transfer transistor;
forming a second metal plug in the second opening such that the second metal plug is in contact with the gate of the common emitter transistor;
forming a vertically-oriented reset diode in the third opening such that the reset diode is in contact with the floating diffusion node; and
forming a vertically-oriented set diode in the fourth opening such that the set diode is in contact with both the floating diffusion node and a drain of the common emitter transistor.

15. The method of claim 14, wherein the vertically-oriented set diode is formed with its anode proximate the floating diffusion region, and wherein the vertically-oriented reset diode is formed with its cathode proximate the floating diffusion region.

16. The method of claim 15, further comprising:

forming a metal interconnect between the cathode of the vertically-oriented set diode and the drain of the common emitter transistor; and forming a switch in electrical communication with the metal interconnect.

17. The method of claim 14, wherein said forming a vertically-oriented reset diode comprises:

forming a first vertical portion of the vertically-oriented reset diode by depositing a doped semiconductor of a first doping level of a given doping type in the third opening in electrical contact with the floating diffusion node; and forming a second vertical portion of the vertically-oriented reset diode in the third opening by depositing a doped semiconductor of a second doping level of the given doping type, wherein the second vertical portion is in electrical contact with the first vertical portion, and wherein the second doping level is greater than the first doping level.

18. The method of claim 17, wherein the first and second vertical portions are formed from a p-type doped material.

19. The method of claim 14, wherein said forming a vertically-oriented reset diode comprises filling the third opening with an epitaxially grown p-type silicon, a p-type doped polysilicon, or an amorphous silicon.

20. A method for making a pixel of an image sensor, the method comprising:
 forming an n-type floating diffusion node in a substrate;
 forming a dielectric layer over the floating diffusion node, where the dielectric layer includes an opening extending vertically through the dielectric layer to the floating diffusion node; and
 forming a vertically-oriented reset diode in the opening such that the reset diode is in contact with the floating diffusion node, wherein forming the vertically-oriented reset diode includes depositing a p-type doped semiconductor in electrical contact with the n-type floating diffusion node.

21. The method of claim 20, further comprising forming a further vertical portion by depositing a $p^+$ doped semiconductor in electrical contact with the vertical portion.

* * * * *